(12) United States Patent
Hayakawa

(10) Patent No.: US 7,488,186 B1
(45) Date of Patent: Feb. 10, 2009

(54) JUNCTION BOX TO BE MOUNTED ON MOTOR VEHICLE

(75) Inventor: Tatsuya Hayakawa, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/213,080

(22) Filed: Jun. 13, 2008

(30) Foreign Application Priority Data

Jul. 20, 2007 (JP) .............................. 2007-190222

(51) Int. Cl.
*H01R 12/00* (2006.01)
(52) U.S. Cl. .................................................... 439/76.2
(58) Field of Classification Search ................ 439/76.1, 439/76.2
See application file for complete search history.

(56) References Cited

U.S. PATENT DOCUMENTS

| | | | |
|---|---|---|---|
| 6,077,102 A | 6/2000 | Borzi et al. | |
| 6,150,734 A | 11/2000 | Neibecker et al. | |
| 7,252,519 B2 * | 8/2007 | Saka | 439/76.2 |

2008/0014767 A1 1/2008 Oka et al.

FOREIGN PATENT DOCUMENTS

| JP | A-2006-254528 | 9/2006 |
|---|---|---|
| JP | B2 3888368 | 12/2006 |

\* cited by examiner

*Primary Examiner*—Tho D Ta
(74) *Attorney, Agent, or Firm*—Oliff & Berridge, PLC

(57) ABSTRACT

A junction box has a casing assembly including an upper casing and a lower casing, a laminated unit including bus bars and insulation plates, and first and second printed circuit boards contained in the casing assembly. The first printed circuit board is used as a higher current circuit having thick-film conductors. The second printed circuit board is used as a middle or lower current circuit having thin-film conductors with thicknesses smaller than those of the thick-film conductors on the first printed circuit board. Board relays are mounted on a part of different peripheral portions on both sides of the first printed circuit board or a part of peripheral portion of either side of the first printed circuit board. The board relays are disposed in the casing assembly to be opposed to a first heat generating element containing space defined between a front side of the first printed circuit board and an inner surface of a top wall of the upper casing, and a second heat generating element containing space defined between a rear side of the first printed circuit board and an inner surface of a bottom wall of the lower casing.

4 Claims, 8 Drawing Sheets

JUNCTION BOX TO BE MOUNTED ON MOTOR VEHICLE

The present application relates to a junction box to be mounted on a motor vehicle and more particularly relates to a junction box that improves an attaching position of a plurality of higher current relays that are large sizes and heat generation elements, thereby downsizing the junction box and taking measures against heat generation.

BACKGROUND

A junction box to be mounted on a motor vehicle may be required to accommodate a plurality of printed circuit boards, on which electric and electronic components are mounted, and higher current relays together with conventional common laminated unit including bus bars and insulation plates, in association with a rapid increase of the electric and electronic components to be mounted on the motor vehicle. In particular, the higher current relays that are heat generating elements are inserted into and connected to a relay containing section provided on an exterior of an upper casing or a lower casing in view of heat radiation. Since a plug-in type relay having a great height projects from an exterior of a casing assembly, there is a problem that the junction box has tended to be upsized. Because the plug-in type relay is relatively heavy, there is also a problem that the junction box becomes heavy.

In order to overcome the above problems, it has been attempted that all or a part of the plug-in type relays to be connected to a relay containing section provided on an exterior of a casing assembly are exchanged for board relays to be mounted on printed circuit boards contained in the casing assembly, because the board relays mounted on the printed circuit boards are smaller in height and lighter in weight than the plug-in type relays.

For example, a junction box disclosed in Japanese Patent No. 3888368, as shown in FIG. 6 of the present application, has a casing assembly including an upper casing 1, an intermediate casing 2, and a lower casing 3. A laminated unit 4 including bus bars and insulation plates is contained in an upper part of a space between the upper casing 1 and the intermediate casing 2, while a first printed circuit board 5 is contained in the lower part of the space. A multifunction interexchange unit 6 is disposed in a space between the intermediate casing 2 and the lower casing 3 and a relay unit 7 is disposed below the interexchange unit 6 in the space. The multifunctional interexchange unit 6 is provided with a second printed circuit board 8 while the relay unit 7 is provided with a third special printed circuit board 9 for a board relay 9a. The first, second, and third printed circuit boards 5, 8, and 9 are connected to one another through interexchange connectors provided in the multifunctional interexchange unit 6.

In the junction box constructed above, by providing the third special printed circuit board 9 for a board relay in the casing assembly, the number of plug-in type relays to be inserted into the relay containing section on the exterior of the casing assembly is decreased. However, it is necessary to provide the third special printed circuit board 9 for the board relay. This will increase the number of the printed circuit boards. Furthermore, as shown in FIG. 8, the containing portion for the third printed circuit board 9 projects from the casing assembly. This will incur upsizing of the junction box.

Because a circuit on the third special printed circuit board for the board relay is interconnected to a circuit of conductors on the first and/or second printed circuit boards, connecting terminals must be soldered to the first and/or second printed circuit boards and connectors for these connecting terminals must be mounted on the boards. This will increase a count of components and assembling steps, and peripheral portions of the first, second, and third printed circuit boards are occupied by the connecting terminals and connectors.

In addition, in order to interconnect conductors on the first, second, and third boards superimposed on one another, a length (height) of each connector and each connecting terminal to be mounted on the board in a vertical direction will become large. There is a problem that upsizing of the junction box cannot be suppressed on account of containing the special printed circuit board for the relay in the casing assembly.

If the board relays are provided on the first and second printed circuit boards without providing the special board for the relay, the first and second printed circuit boards must be upsized, and conductors for a higher current circuit connected to the board relays and conductors for a lower or middle current circuit must be provided on a single printed circuit board. Because thicknesses of conductors on a single printed circuit board must be uniform, the higher current circuit will require a great area of conductors. This will impede downsizing of the board.

Further, if the higher current relay that has a great amount of heat generation is contained as a board relay in the casing assembly, because interior circuits, such as the bus bars, the printed circuit board, or the like, are contained in the casing assembly, and because the electric and electronic components that are relatively weak in heat are mounted on the printed circuit board, there is a problem that the interior circuits will be susceptible to heat generated from the board relays.

SUMMARY

In view of the above problems, an object of the present application is to provide a junction box that can mount relays on a printed circuit board without increasing the size of the printed circuit boards, can reduce a count of components significantly, can reduce a thickness and a weight, and can lower a cost.

In order to overcome the above problems, a junction box to be mounted on a motor vehicle may include a casing assembly including an upper casing and a lower casing. A laminated unit including bus bars and insulation plates, and first and second printed circuit boards may be contained in the casing assembly. The first printed circuit board may be used as a higher current circuit having thick-film conductors. The second printed circuit board may be used as a middle or lower current circuit having thin-film conductors with thicknesses smaller than those of the thick-film conductors on the first printed circuit board. Board relays may be mounted on a part of different peripheral portions on both sides of the first printed circuit board or a part of peripheral portion of either of the both sides of the first printed circuit board. The board relays may be disposed in the casing assembly to be opposed to a first heat generating element containing space defined between a front side of the first printed circuit board and an inner surface of a top wall of the upper casing, and/or a second heat generating element containing space defined between a rear side of the first printed circuit board and an inner surface of a bottom wall of the lower casing. The upper casing and/or the lower casing may be provided with a relay containing section for plug-in type relay to be connected to the bus bars. The relay containing section is arranged in a position separated away from a position opposed to a mounting position of the board relays.

As described above, the junction box of the present application eliminates the third special printed circuit board for the relay that has been required in the prior art junction box disclosed in Japanese Patent No. 3888368 and includes the first and second printed circuit boards. Consequently, any terminal members and mounting connectors for interconnecting the conductors on the first, second, and third printed circuit boards are not required, and thus a count of components and assembling steps are reduced. Furthermore, it is possible to reduce a space of the peripheral portions of the printed circuit boards occupied by the components and to prevent the casing assembly from being upsized due to accommodation of the third printed circuit board.

In addition, the conductors on the first printed circuit board that mounts the board relays may have thicknesses of more than 35 micrometers ($\mu$m). This will enable to provide a higher current circuit to be connected to the board relays without increasing widths of the conductors. Because the mounting connectors provided on the peripheral portions of the printed circuit boards can be reduced, as described above, it is not necessary to enlarge an area of the first printed circuit board, as in the case of the conventional junction box.

Also, in the case where the board relays are mounted on both sides of the first printed circuit board, it is possible to prevent a part of the first printed circuit board from being heated, because plural board relays are concentrically disposed on a part of the different peripheral portions of the first printed circuit board. Because the board relays are disposed toward the first and second heat generating element containing spaces defined among the first printed circuit board, the upper casing, and the lower casing, it is possible to prevent the heat generated from the board relays from affecting the other interior circuits and to efficiently contain the board relays in the casing assembly without providing a projection extending outward on the casing assembly, thereby restraining the junction box from being upsized.

Also, because the board relays are mounted on the first printed circuit board in the present invention, it is possible to reduce the number of the plug-in type relays that are accommodated in the relay containing section on the casing assembly and have large sizes and heavy weights, thereby realizing reduction in size and weight.

Furthermore, because the plug-in type relay are disposed on the top wall of the upper casing and/or the bottom wall of the lower casing and are not disposed directly above or below the board relays mounted on the first printed circuit board, and because the plug-in type relay containing section are provided at the position away from the board relays, it is possible to disperse heat generating area, thereby preventing a local heating.

Preferably, the laminated unit including bus bars and insulation plates may be disposed between the first printed circuit board and the upper casing. A part of the laminated unit is cut off. The first heat generating element containing space is defined between the first printed circuit board and an inner surface of a top wall of the upper casing. The second printed circuit board may be disposed on a lower casing side of the first printed circuit board. The second printed circuit board has an area smaller than that of the first printed circuit board. The second printed circuit board may not be disposed on a position of arranging the board relays on the first printed circuit board. The second heat generating element containing space is defined between the first printed circuit board and an inner surface of a bottom wall of the lower casing.

As described above, because the board relays are mounted on a part of the different peripheral portions on both sides of the first printed circuit board, the second printed circuit board opposed to the first printed circuit board becomes a small area. By cutting off a part of the peripheral portion of the laminated unit including the bus bars and insulation plates, it is possible to efficiently form the first and second heat generating element containing spaces. Thus, by efficiently utilizing a space in the casing assembly, it is possible to restrain the whole casing assembly from being upsized and to prevent the heat generated from the board relays from affecting the second printed circuit board and laminated unit.

Preferably, the first printed circuit board having the thick-film conductors may be a multilayered printed circuit board laminating a plurality of layers. The thick-film conductors on the first printed circuit board may form branched circuits. The second printed circuit board may be superimposed on and separated away from the first printed circuit board. The conductors on the first and second printed circuit boards may be electrically interconnected through conductor pins. Electric and electronic components may be mounted on both sides of the second printed circuit board.

Because the thick-film conductors on the first printed circuit board may have thicknesses larger than those of the usual conductors of 35 micrometers ($\mu$m), it is possible to provide a higher current circuit that can mount the board relays. Because the board provided with the thick-film conductors are the multilayered printed circuit board laminating a plurality of layers (for example, four layers), it is possible to restrain the first printed circuit board from being upsized.

Because the board relays are mounted on only a part of the different peripheral portions on both sides of the first printed circuit board, the other conductors can be provided as branched circuits in a high density.

Also, because the second printed circuit board is disposed on and separated away from the first printed circuit board mounting the board relays and the electric and electronic components having a relatively weak performance in heat are mounted on the second printed circuit board, it is possible to lower a thermal effect due to the heat generated from the board relays. The second printed circuit board may be formed into a multilayered printed circuit board laminating a plurality of layers and the electric and electronic components may be mounted on the conductors on both sides of the second printed circuit board.

Thus, because the board relays and plug-in type relays that have large amounts of heat generation are separated away from each other, it is possible to eliminate an overheating area in spite of the downsized junction box.

As described above, in the junction box to be mounted on the motor vehicle in accordance with the present application, because the board relays are disposed on the different peripheral portions on both sides of the first printed circuit board provided with thick-film conductors or on the peripheral portion of either of both sides of the first printed circuit board, and because these board relays are disposed to oppose the heat generation element containing spaces defined between the printed circuit board and the inner surface of the casing assembly, it is possible to mount desired higher current relays on the first printed circuit board without giving a thermal effect to the other circuit components and upsizing the casing assembly.

Because the conductors on the first printed circuit board has a large thickness, it is possible to mount the board relays on the first printed circuit board without increasing the conductor area and thus it is unnecessary to upsize the first printed circuit board.

In addition, because the present application does not require the third special printed circuit board that has been required by the prior art disclosed in Japanese Patent No. 3888368 and only the first and second printed circuit boards constitute the printed circuit board unit, it is possible to reduce terminal members and mounting connectors that serve to interconnect the conductors on the printed circuit boards, thereby lowering costs of components and assembling steps significantly.

DETAILED DESCRIPTION OF EMBODIMENTS

Referring now to FIGS. 1 to 7, embodiments of a junction box to be mounted on a motor vehicle in accordance with the present application will be described below in detail.

Figure 1:
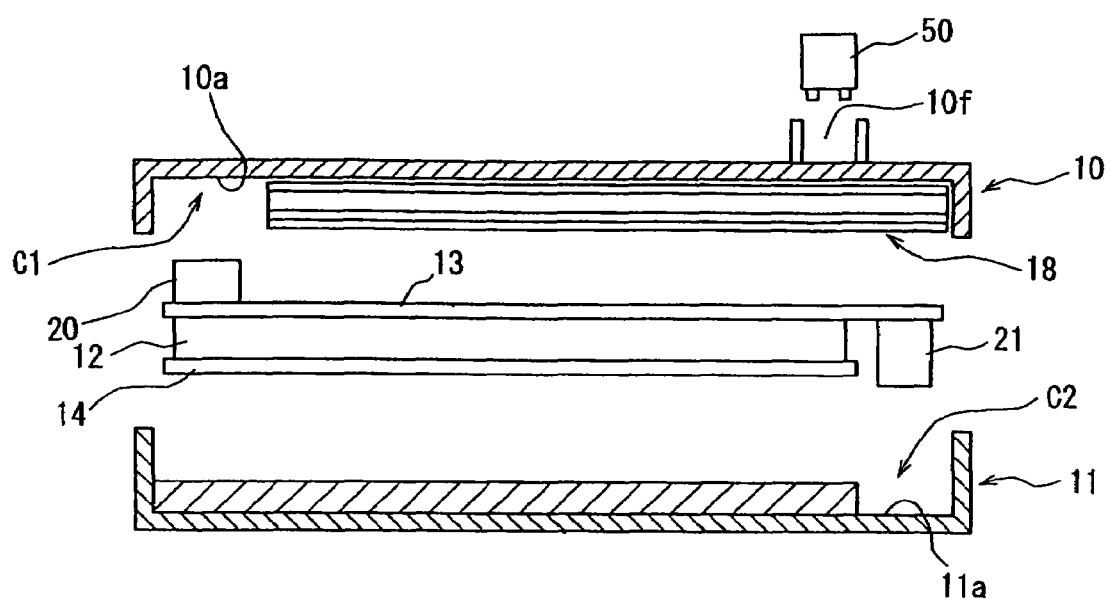
FIG. 1 is a schematically exploded section view of a junction box in accordance with the present application.
Figure 2:
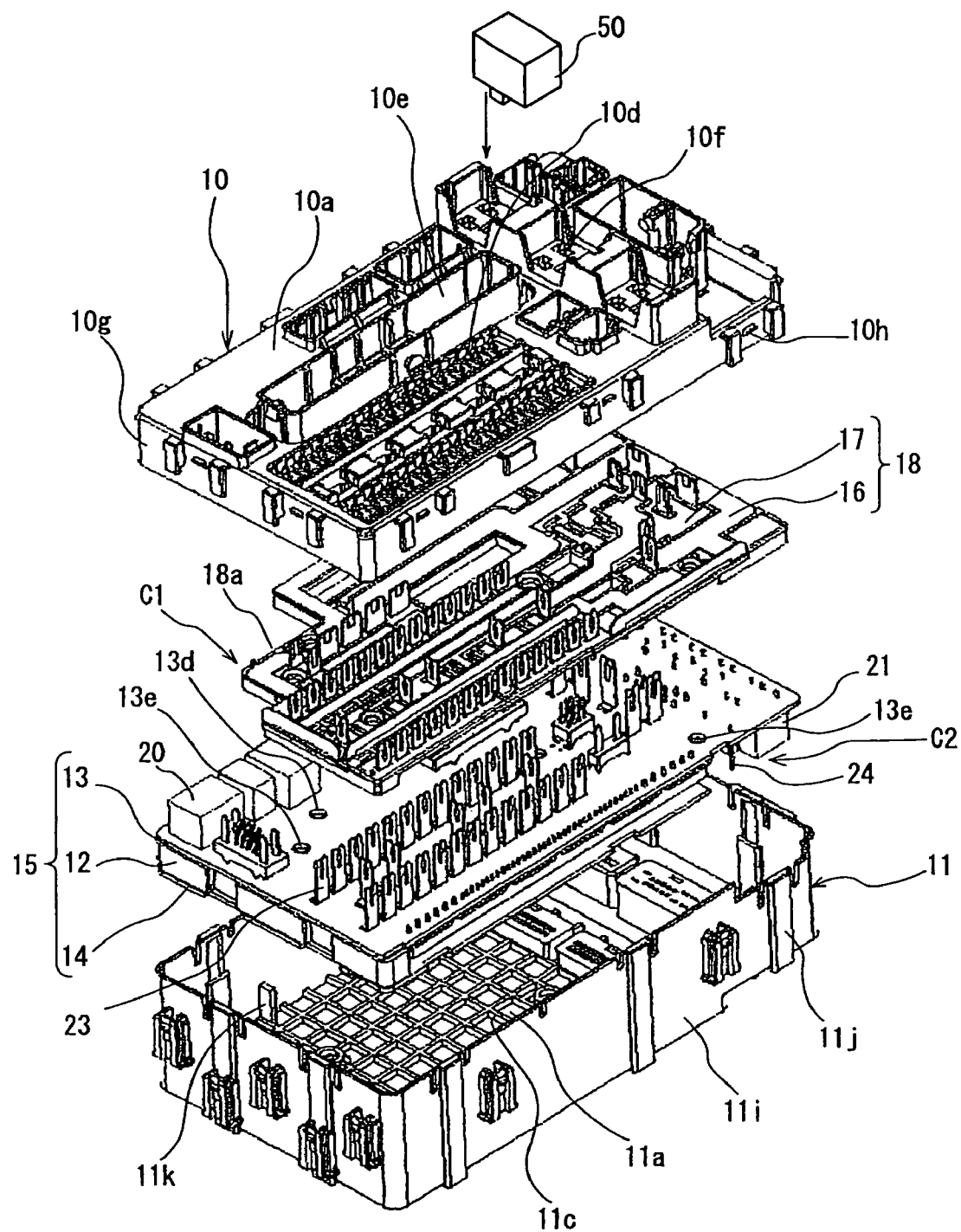
FIG. 2 is an exploded perspective view of the junction box in accordance with the present application.
Figure 3A:
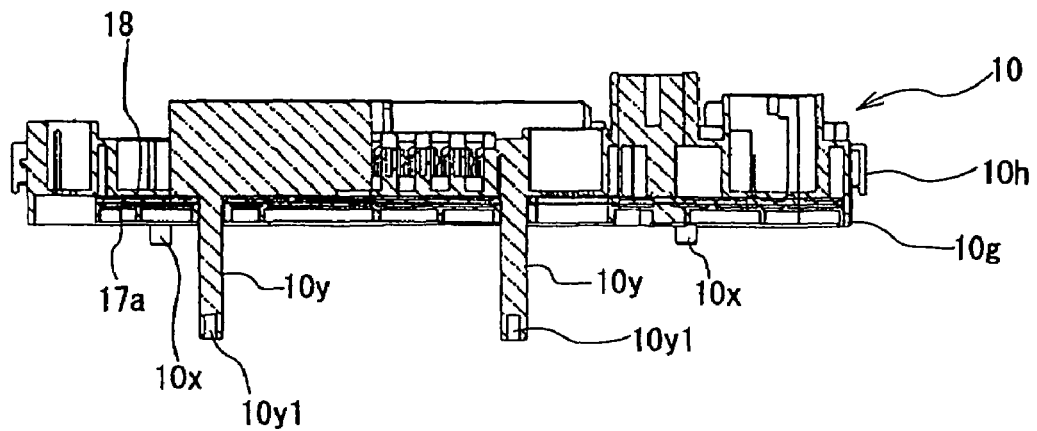
FIG. 3A is a sectional view of an upper casing to which a laminated unit including bus bars and insulation plates is attached.

As shown in FIGS. 1 to 3, the junction box may include a casing assembly having an upper casing 10 and a lower casing 11. A bus bar laminated unit 18, in which bus bars 16 and insulation plates 17 may be alternately laminated, and a board unit 15 including a first printed circuit board 13, a spacer 12, and a second printed circuit board 14 are contained in the casing assembly so that they are arranged from the upper casing 10 to the lower casing 11.

Shorter size fixing bars 10x may be integrated with an inner surface of a top wall 10a of the upper casing 10 and extend downward from the inner surface. The shorter size fixing bars 10x may penetrate the bus bar laminated unit 18, first printed circuit board 13, and spacer 12 to fix them on the upper casing 10 by first screws N1. Longer size fixing bars 10y may penetrate the bus bar laminated unit 18, first printed circuit board 13, spacer 12, second printed circuit board 14, and lower casing 11 to fix them on the lower casing 11 by second screws N2. Thus, the junction box is assembled.

The bus bar laminated unit 18 may be mounted on a top surface (front side) on the first printed circuit board 13. The bus bar laminated unit 18 may be provided with a cut-off space 18a. The cut-off space 18a between a top surface of the first printed circuit board 14 and the inner surface of the top wall 10a of the upper casing 10 may define a first heat generation element containing section C1.

The second printed circuit board 14 may be disposed below the first printed circuit board 13 through the spacer 12. An area of the second printed circuit board 14 may be smaller than that of the first printed circuit board 13. The second printed circuit board 14 may not be disposed on one side of the first printed circuit board 13. A second heat generating element containing section C2 is defined between a bottom surface (rear side) of the first printed circuit board 13 and the inner surface of a bottom wall 11a of the lower casing 11.

The first printed circuit board 13 may be a multilayered printed circuit board including four layers. Each layer may be provided with a thick-film conductor pattern for a higher current circuit to form branched circuits.

Figure 4:
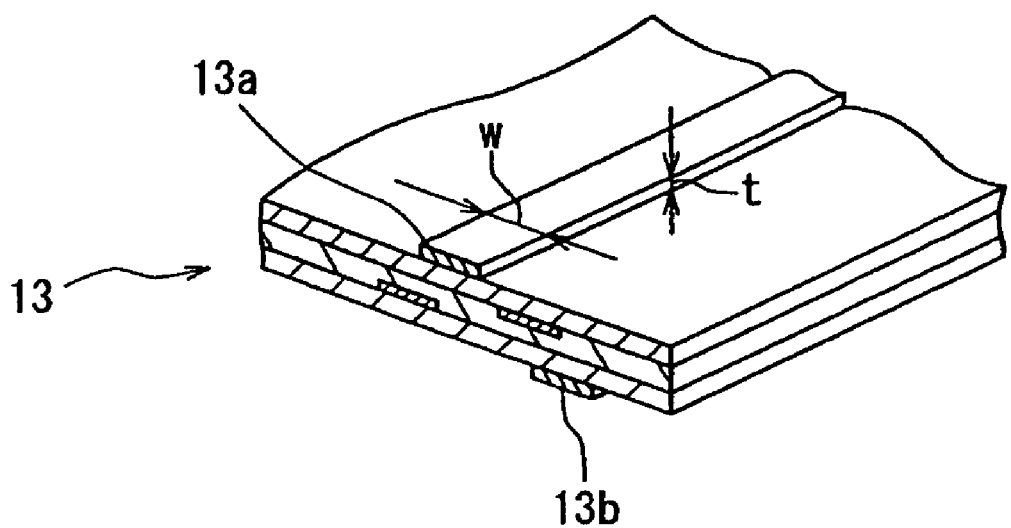
FIG. 4 is an enlarged perspective view of a main part of a first printed circuit board.

As shown in FIG. 4, a thickness (t) of a thick-film conductor 13a may be more than about 35 micrometers (μm). By increasing the thickness (t), a higher current circuit can be obtained without increasing a width (w) of a conductor pattern.

A plurality of board relays 20 may be disposed upward along corners on one side of the top surface of the first printed circuit board 13 at the position opposed to the first heat generating element containing space C1 to be electrically connected to the thick-film conductor 13a.

Also, a plurality of board relays 21 may be disposed downward on the bottom surface of the first printed circuit board 13 at the position opposed to the second heat generating element containing space C2 to be electrically connected to a thick-film conductor 13b.

Thus, the board relays 20 and 21 may be mounted on both sides of the first printed circuit board 13 provided with thick-film conductors 13a, 13b, and the board relays 20, 21 may be separated away from each other and opposed to the first and second heat generating element containing spaces C1 and C2, respectively.

Furthermore, terminal members 23 may be soldered to the thick-film conductors 13a on the first printed circuit board 13 to project upward. The terminal members 23 may project in the fuse containing section 10d, connector containing section 10e, and plug-in type relay containing section 10f in the top wall 10a of the first printed circuit board 13.

Terminal members 24 may be soldered downward to the bottom surface of the first printed circuit board 13 at an inner position from the board relay 21 and project in the connector containing section 11b in the bottom wall 11b of the lower casing 11.

The second printed circuit board 14 may be disposed through a spacer 12 made of a resin material on the first printed circuit board 13 at the lower casing side. A thickness of each conductor on the second printed circuit board 14 may be smaller than that on the first printed circuit board 13. A conductor pattern for a middle or lower current circuit may be provided on the second printed circuit board 14.

Figure 5A:
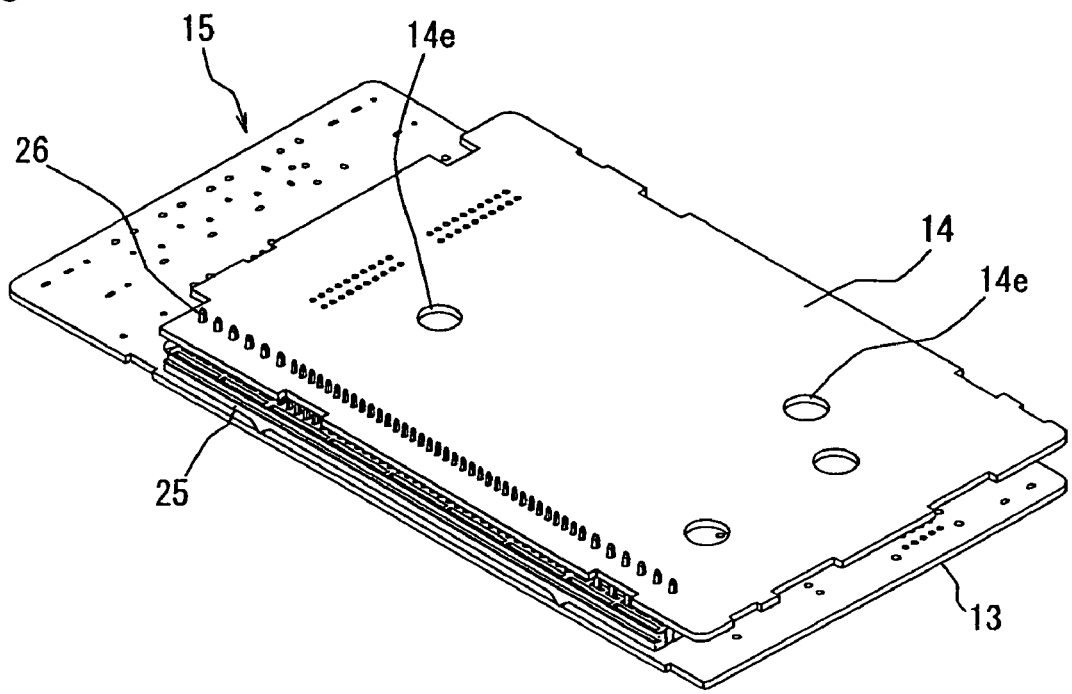
FIG. 5A is a perspective view of the board unit, illustrating a bottom side of the board unit.
Figure 5B:
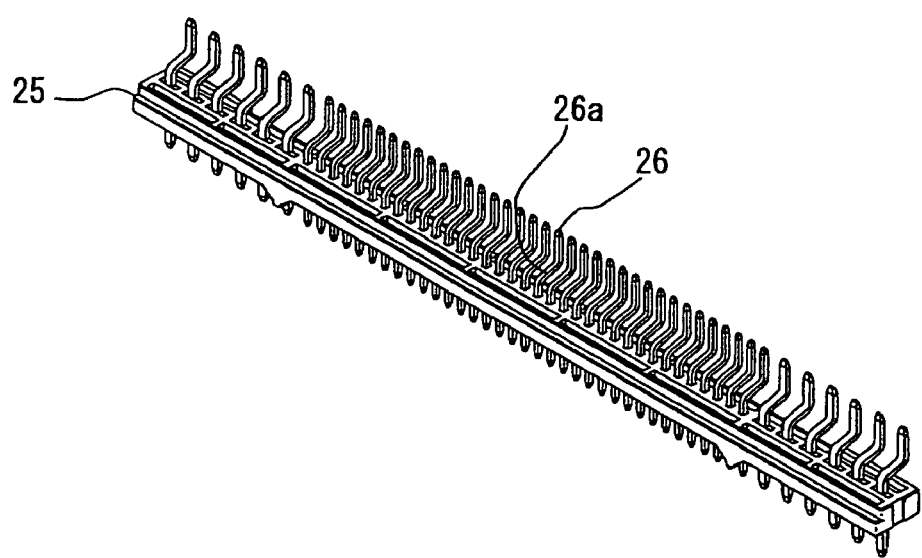
FIG. 5B is a perspective view of a terminal support base on which connecting terminals are fixed, illustrating a bottom side of the terminal support base.

The conductors on the first and second printed circuit boards 13 and 14 may be interconnected through pin-like connecting terminals 26 soldered to the conductors. The connecting terminals 26 may be secured in guide holes in a terminal support base 25. The terminal support base 25 may be mounted on a peripheral portion on one side on which the board relays 20 and 21 are not mounded. As shown in FIG. 5B, each connecting terminal 26 may be provided on an intermediate part with a bent portion 26a to prevent a stress from applying to soldered portions on the opposite ends.

Electric and electronic components (not shown) may be mounted on both sides of the second printed circuit board 14.

The spacer 12 may be disposed between the first printed circuit board 13 and the second printed circuit board 14 and may be a product made of an insulation resin material and having a configuration shown in FIG. 6. The spacer 12 may include a substantially rectangular base portion 12a and an outer peripheral frame 12d that projects in a vertical direction from an outer peripheral edge of the base portion 12a. The base portion 12a may be provided substantially on a whole top surface with substantially grid-like ribs 12c for reinforcement and prevention against deformation. As shown in FIG.

3B, the first printed circuit board 13 may be disposed on top surfaces of the ribs 12c. The base portion 12a may not be provided on a bottom surface with the ribs 12c. The second printed circuit board 14 may be disposed on a bottom surface of the outer peripheral frame 12d.

Thus, the reinforcement ribs 12c may be provided on the top surface of the base portion 12a to reinforce the whole spacer and to prevent the spacer from causing any shrinkage holes or cambers. The ribs 12c may be formed on the opposite sides of the spacer 12.

Two cylindrical longer size fixing bars 10y may extend from an inner surface on the top wall of the upper casing 10 substantially at the opposite sides of a center of the top wall in a diagonal direction. Four shorter size fixing bars 10x may extend at the four corners of the top wall. A length of each longer size fixing bar 10y may be set to reach a bottom wall 11a of the lower casing 11, while a length of each shorter size fixing bar 10x is set to reach a base portion 12a of the spacer 12. The shorter size fixing bars 10x may be covered with the second printed circuit board 14 at the lower surface side of the spacer 12. The longer size and shorter size fixing bars 10y and 10x may be formed into cylindrical configurations and are provided with threaded holes 10y1 and 10x1 at their lower end openings.

Figure 6A:
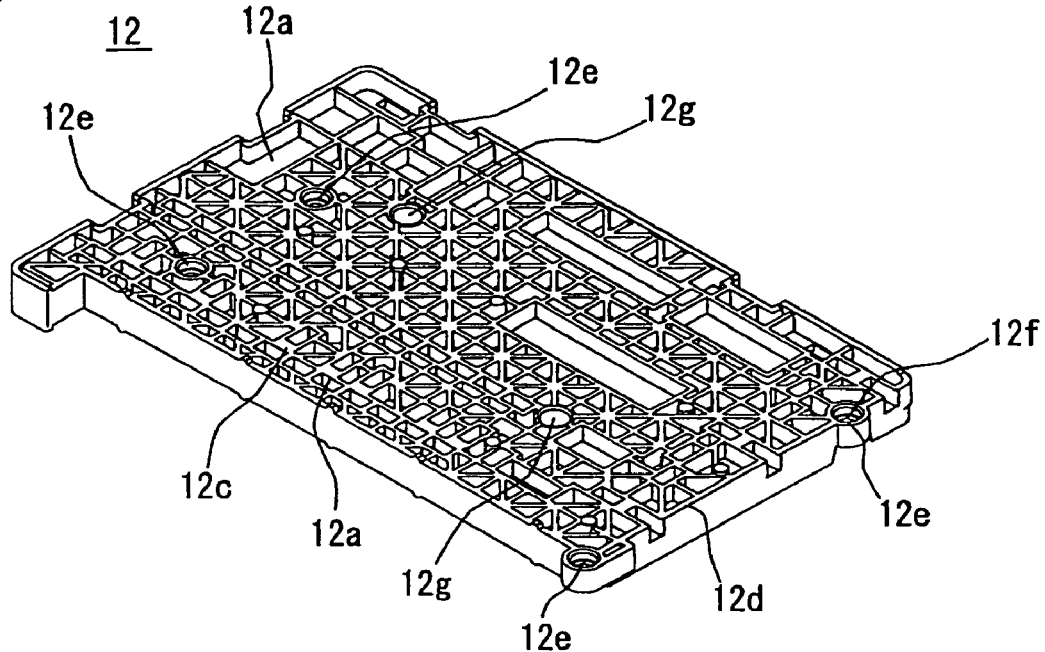
FIG. 6A is a perspective view of a spacer.
Figure 6B:
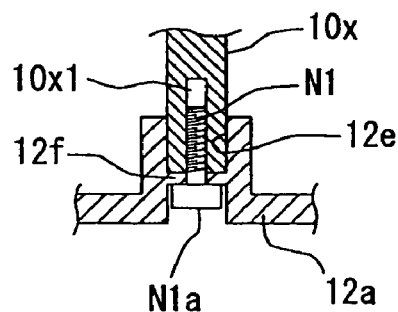
FIG. 6B is an enlarged sectional view of a main part of the spacer.
Figure 6C:
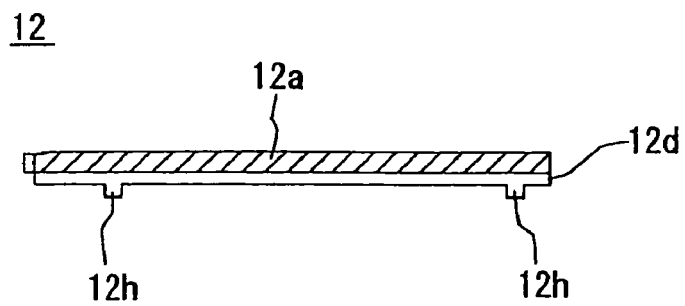
FIG. 6C is a sectional view of the spacer taken along a longitudinal side of the spacer shown in FIG. 6A.
Figure 7:
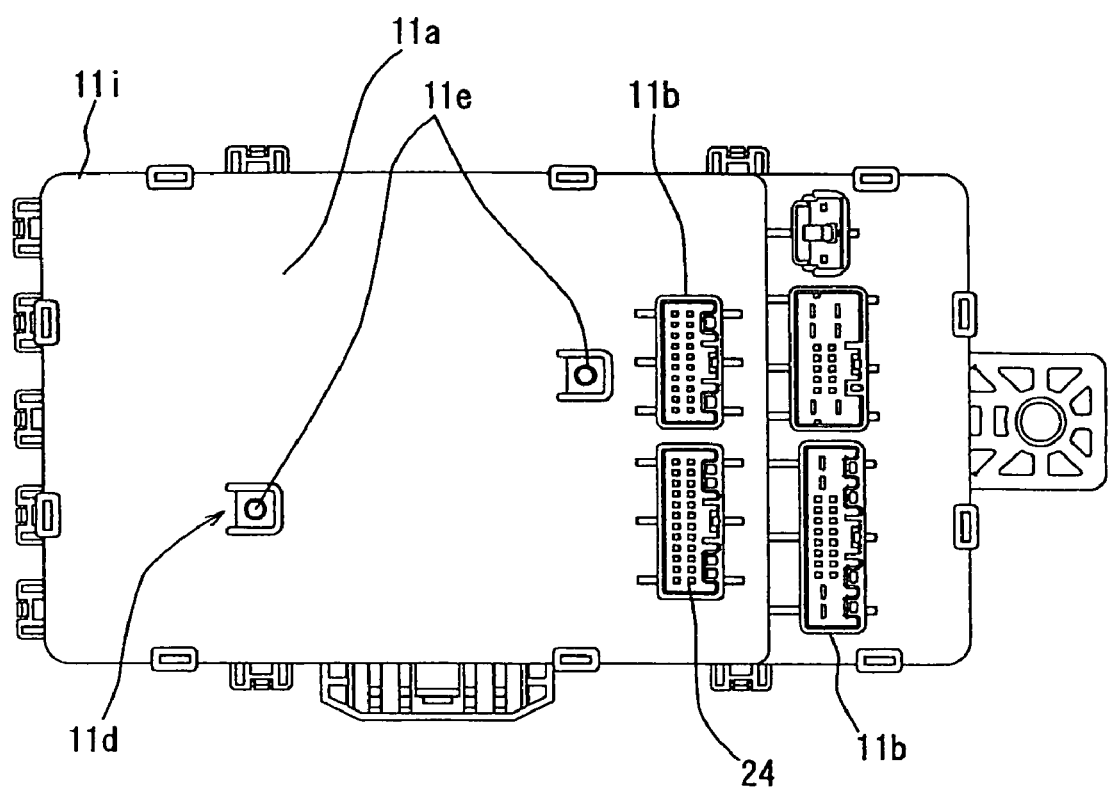
FIG. 7 is a bottom side view of a lower casing.
Figure 8:
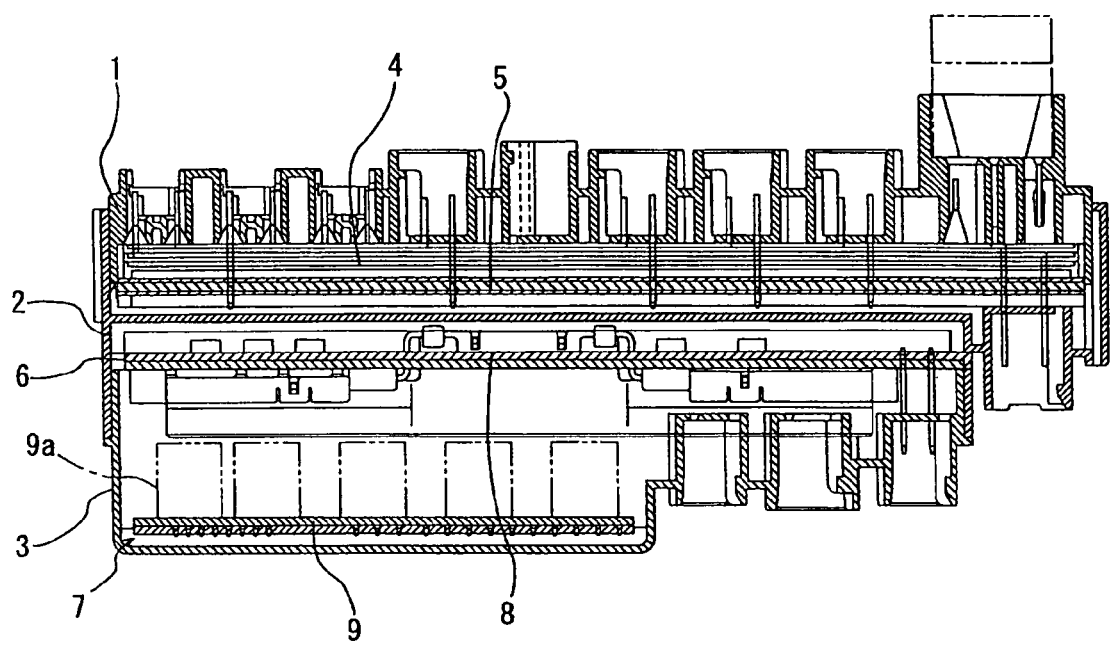
FIG. 8 is a longitudinal sectional view of a conventional junction box.

As shown in FIG. 6A, the base portion 12a of the spacer 12 may be provided with fixing holes 12e at four positions corresponding to the projecting positions of the four shorter size fixing bars 10x. As shown in FIG. 6B, each of the fixing holes 12e may be provided on an inner surface with an annular flange portion 12f. A top surface of the flange portion 12f may receive a lower end surface of the shorter size fixing bar 10x, while a bottom surface of the flange portion 12f may receive a head portion N1a of the first screw N1 inserted upward into the fixing hole 12e. Also, the spacer 12 may be provided with two through-holes 12g at the positions corresponding to the projecting positions of two longer size fixing bars 10y.

In addition, engaging pawls 12h (FIG. 6c) may extend from a lower end surface on a downward projecting portion of the outer peripheral frame 12d of the spacer 12. The second printed circuit board 14 may contact with a lower end surface of the outer peripheral frame 12d. The engaging pawls 12h lock the peripheral edge of the second printed circuit board 14.

Figure 3B:
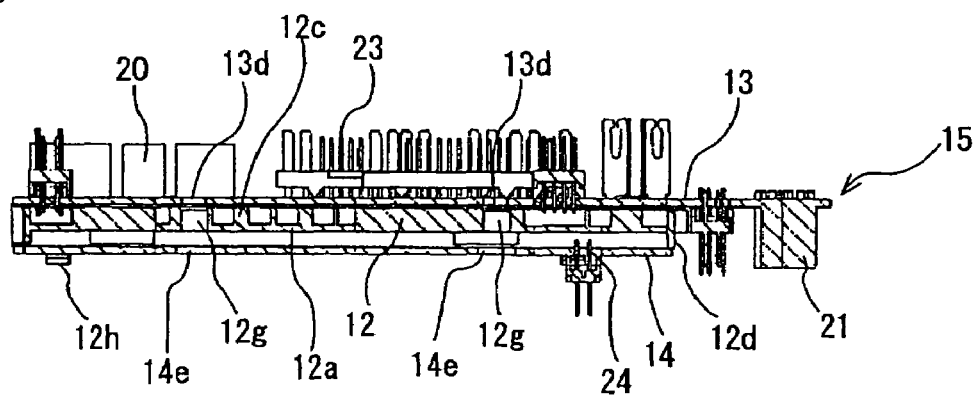
FIG. 3B is a sectional view of a board unit.

As shown in FIGS. 2 and 3B, the first printed circuit board 13 to be disposed on the top surface of the spacer 12 may be provided with through-holes 13e and 13d that permit the shorter size fixing bars 10x and the longer size fixing bars 10y to penetrate. On the other hand, the second printed circuit board 14 to be disposed on the bottom surface of the spacer 12 is provided with through-holes 14e that permit the longer size fixing bars 10y to penetrate.

The upper casing 10 may be provided on the top wall 10a with a fuse containing section 10d, a connector containing section 10e, and a plug-in type relay containing section 10f. A plug-in type relay 50 may be inserted into the plug-in type relay containing section 10f. The plug-in type relay containing section 10f may be provided in the upper casing 10 at a position of a central side away from the position opposed to the board relay 20 mounted on the first printed circuit board 13.

The upper casing 10 may be provided on an exterior of a peripheral wall 10g with a locking portion 10h to be locked on the lower casing 11.

The lower casing 11 may be provided substantially on a whole top surface of the bottom wall 11a with grid-like ribs 11c for reinforcement and on an outer peripheral portion of the bottom wall 11a with longer size ribs 11k extending upward. Upper end surfaces of the longer size ribs 11k contact with the bottom surface of the second printed circuit board 14 to perform positioning and holding functions. Recesses 11d may be provided in the bottom wall 11a of the lower casing 11 at the positions opposed to the projecting positions of the longer size fixing bars 10y. Each of the recesses 11d may be provided on a bottom wall with a fixing hole 11e to pass the second screw N2. Lower surfaces of the longer size fixing bars 10y may be put on upper surfaces of the recesses 11d. The lower surface of each recess 11d may serve as an engaging surface with a head portion N2a of the second screw N2 to be inserted into the fixing hole 11e from the lower side.

Figure 3C:
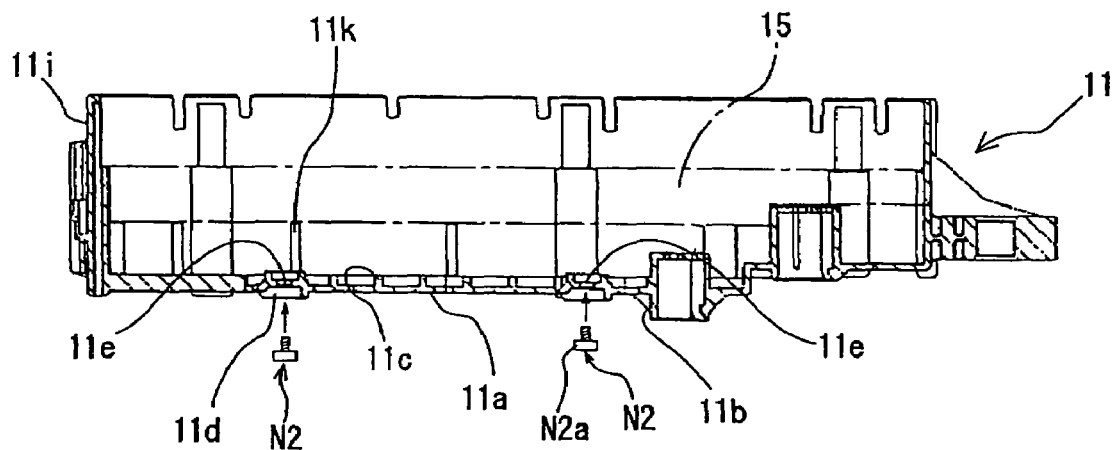
FIG. 3C is a sectional view of a lower casing.

As shown in FIG. 2 and FIG. 3C, the peripheral wall 11i of the lower casing 11 may have a height that reaches a top surface of the junction box, and thus the lower casing 11 may be formed into a deep box-like configuration. When the peripheral wall 11i of the lower casing 11 is fitted on the exterior of the peripheral wall 10g of the upper casing 10, the locking portions 10h on the exterior of the peripheral wall 10g may engage with the locked portion 11j provided on the peripheral wall 11i.

Next, a procedure for assembling the junction box will be described below.

Firstly, the upper casing 10 may be turned in an upside-down position so that the shorter size fixing bars 10x and longer size fixing bars 10y may project upward. The bus bar laminated unit 18 including the bus bars 17 and insulation plates 16 may be inserted into the upper casing 10. The longer size fixing bars 10y and shorter size fixing bars 10x may be inserted into the through-holes in the bus bar laminated unit 18 from the upper side. The bus bar laminated unit 18 may be contained in the upper casing 10.

Secondly, the first printed circuit board 13 may be inserted into the upper casing 10 from the upper side. The shorter size and longer size fixing bars 10x and 10y projecting from the bus bar laminated unit 18 may be inserted into the through-holes 13e and 13d in the first printed circuit board 13 from the upper side. The first printed circuit board 13 may be disposed on the insulation plate 17 on the lowermost layer (uppermost layer in the assembling steps) of the bus bar laminated unit 18. An end of each connecting terminal 26 supported by a terminal support base 25 may be soldered to the conductors on the first printed circuit board 13 in advance. The connecting terminals 26 may project from the terminal support base 25.

Then, the spacer 12 may be inserted into the upper casing 10 from the upper side. The longer size fixing bars 10y may be inserted into the through-holes 12g in the spacer 12. The shorter size fixing bars 10x may be inserted into the fixing holes 12e in the spacer 12. The lower end surfaces of the shorter size fixing bars 10x may contact with the flanges 12f in the fixing holes 12e. Under this condition, the first screws N1 may be inserted into the fixing holes 12e and screwed into the threaded holes 10x1 in the shorter size fixing bars 10x.

Thus, the bus bar laminated unit 18 may be contained in the upper casing 10 to project from the casing 10, and the first printed circuit board 13 and spacer 12 may be superimposed on and secured to the bus bar laminated unit 18.

Then, the second printed circuit board 14 may be inserted into the upper casing 10 from the upper side. The connecting terminals 26 projecting from the first printed circuit board 13 may be inserted into the terminal holes in the second printed circuit board 14. The longer size fixing bars 10y may be inserted into the through-holes 14e in the second printed circuit board 14. The second printed circuit board 14 may be put on the distal end of the outer peripheral frame 12d of the spacer 12. The engaging pawls 12h projecting from the outer peripheral frame 12d may lock the second printed circuit board 14. Under this condition, the other ends of the connecting terminals 26 may be soldered to the conductors on the second printed circuit board 14.

Finally, the lower casing 11 may be mounted on the upper casing 10 from the upper side. The peripheral wall 10g of the upper casing 10 may be fitted on the inner surface of the peripheral wall 11i of the lower casing 11. The lower end surfaces of the longer size fixing bars 10y may contact with the upper surfaces of the recesses 11d around the fixing holes 11e in the lower casing 11. Under this condition, the second screws N2 may be inserted into the fixing holes 11e in the lower casing 11 from the upper side and screwed into the threaded holes 10y1 in the longer size fixing bars 10y. The peripheral wall 10g of the upper casing 10 may be fitted on the inner surface of the peripheral wall 11i of the lower casing 11, and the locking portions 10h may couple the locking grooves 11j to each other.

In the junction box constructed above, because the first printed circuit board 13 has a thick-film conductor with a large thickness (t) and a narrow width (w), it is possible to mount the board relays 20 and 21 on the first printed circuit board 13 without upsizing it.

Also, because the board relays 20 and 21 are concentrically mounted on different peripheral portions on both surfaces (front and rear sides) of the first printed circuit board 13, it is possible to enlarge an area for providing branched circuits on the first printed circuit board 13, thereby forming the branched circuits in a high density.

In addition, the board relay 20 mounted on the top surface of the first printed circuit board 13 may be disposed in the first heat generating element containing space C1 defined between the upper casing 10 and the first printed circuit board 13. The board relay 21 mounted on the bottom surface of the first printed circuit board 13 may be disposed in the second heat generating element containing space C2 defined between the first printed circuit board 13 and the lower casing 11. This structure can efficiently utilize an interior of the casing assembly and can contain the board relays 20 and 21 in the casing assembly without upsizing it. Consequently, the number of the plug-in type relay containing sections 10f to be provided in the upper casing 10 can be reduced, and the number of the plug-in type relays to be disposed on and projected from the exterior of the upper casing 10 can be reduced.

In addition, because the board relays 20 and 21 are disposed in the first and second heat generating element containing spaces C1 and C2, heat generated from the board relays 20 and 21 does not affect to the bus bars 16 and second printed circuit board 14. The plug-in relay 50 is inserted into and connected to the plug-in relay connecting section 10f in the upper casing 10. Because the section 10f is disposed not at the position directly above the board relays 20 and 21 but at the position shifted from them, it is possible to prevent the junction box from being heated partially.

Furthermore, because the first printed circuit board 13, on which the board relays having a large amount of heat generation are mounted, is separated through the spacer 12 from the second printed circuit board 14, it is possible to mount the electric and electronic components on both sides of the second printed circuit board 14. Accordingly, it is possible to provide necessary branched circuits and desired components on the second printed circuit board 14, although the size of the second printed circuit board 14 is smaller than that of the first printed circuit board 13.

Thus, because the present application can reduce a thermal effect from the board relays 20 and 21, it is not necessary to provide a special third printed circuit board for mounting the board relays and to contain the third printed circuit board in a bulged lower casing, on the contrary of Japanese Patent No. 3888368, thereby downsizing the junction box.

Although the board relays 20 and 21 are mounted on both sides of the first printed circuit board 13 in the present embodiment, they may be mounted only on a peripheral portion on either side of the first board 13.

What is claimed is:

1. A junction box to be mounted on a motor vehicle, comprising
    a casing assembly including an upper casing and a lower casing;
    a laminated unit including bus bars and insulation plates;
    first and second printed circuit boards contained in said casing assembly, said first printed circuit board configured as a higher current circuit having thick-film conductors, and said second printed circuit board configured as a middle or lower current circuit having thin-film conductors with thicknesses smaller than those of said thick-film conductors on said first printed circuit board; and
    board relays mounted on a part of different peripheral portions on both sides of said first printed circuit board or a part of a peripheral portion of either of the sides of said first printed circuit board, said board relays disposed in said casing assembly opposed to at least one of a first heat generating element containing space defined between a front side of said first printed circuit board and an inner surface of a top wall of said upper casing, and a second heat generating element containing space defined between a rear side of said first printed circuit board and an inner surface of a bottom wall of said lower casing, wherein
    at least one of said upper casing and said lower casing is provided with a relay containing section for a plug-in type relay to be connected to said bus bars, and said relay containing section is arranged in a position separated away from a position opposed to a mounting position of said board relays.

2. A junction box to be mounted on a motor vehicle according to claim 1,
    wherein said laminated unit including bus bars and insulation plates is disposed between said first printed circuit board and said upper casing, a part of said laminated unit is cut off, and said first heat generating element containing space is defined between said first printed circuit board and an inner surface of a top wall of said upper casing; and
    wherein said second printed circuit board is disposed on a lower casing side of said first printed circuit board, said second printed circuit board has an area smaller than that of said first printed circuit board, said second printed circuit board is not disposed on a position of arranging said board relays on said first printed circuit board, and said second heat generating element containing space is defined between said first printed circuit board and an inner surface of a bottom wall of said lower casing.

3. A junction box to be mounted on a motor vehicle according to claim 1,
    wherein said first printed circuit board having said thick-film conductors is a multilayered printed circuit board comprising a plurality of laminated layers, said thick-film conductors on said first printed circuit board form branched circuits, said second printed circuit board is superimposed on and separated away from said first printed circuit board, said conductors on said first and second printed circuit boards are electrically interconnected through conductor pins, and electric and electronic components are mounted on both sides of said second printed circuit board.

4. A junction box to be mounted on a motor vehicle according to claim 2, wherein said first printed circuit board having said thick-film conductors is a multilayered printed circuit board comprising a plurality of laminated layers, said thick-film conductors on said first printed circuit board form branched circuits, said second printed circuit board is superimposed on and separated away from said first printed circuit board, said conductors on said first and second printed circuit boards are electrically interconnected through conductor pins, and electric and electronic components are mounted on both sides of said second printed circuit board.

* * * * *